United States Patent
Cho et al.

(10) Patent No.: US 8,553,186 B2
(45) Date of Patent: Oct. 8, 2013

(54) THIN FILM TRANSISTOR ARRAY SUBSTRATE, DISPLAY PANEL, LIQUID CRYSTAL DISPLAY APPARATUS AND MANUFACTURING METHOD THEREOF

(75) Inventors: An-Thung Cho, Hualien County (TW);
Chia-Tien Peng, Hsinchu County (TW);
Wan-Yi Liu, Hsinchu (TW);
Chun-Hsiun Chen, Hsinchu (TW);
Wei-Ming Huang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 801 days.

(21) Appl. No.: 12/571,449

(22) Filed: Oct. 1, 2009

(65) Prior Publication Data

US 2010/0315580 A1 Dec. 16, 2010

(30) Foreign Application Priority Data

Jun. 16, 2009 (TW) .............................. 98120091 A

(51) Int. Cl.
*G02F 1/133* (2006.01)
(52) U.S. Cl.
USPC ......................................................... 349/116
(58) Field of Classification Search
USPC ......................................................... 349/116
See application file for complete search history.

(56) References Cited

U.S. PATENT DOCUMENTS

| | | | | |
|---|---|---|---|---|
| 2002/0146871 A1* | 10/2002 | Watanabe et al. | ............. | 438/151 |
| 2007/0153177 A1* | 7/2007 | Zhang et al. | .................. | 349/116 |
| 2008/0179762 A1* | 7/2008 | Cho et al. | ............. | 257/E31.001 |
| 2008/0303018 A1* | 12/2008 | Kim et al. | ....................... | 257/13 |
| 2009/0009675 A1* | 1/2009 | Cho et al. | ........................ | 349/43 |
| 2009/0103161 A1* | 4/2009 | Kothari et al. | ................ | 359/245 |
| 2009/0185120 A1* | 7/2009 | Yoon et al. | .................... | 349/116 |
| 2009/0278121 A1* | 11/2009 | Kakkad et al. | .................. | 257/43 |

FOREIGN PATENT DOCUMENTS

TW 200807736 2/2008

OTHER PUBLICATIONS

"First Office Action of China Counterpart Applition," Issued on Aug. 6, 2010, p. 1-p. 5, in Which the Listed Reference was Cited.

* cited by examiner

*Primary Examiner* — Bumsuk Won
*Assistant Examiner* — Charles Chang
(74) *Attorney, Agent, or Firm* — Jianq Chyun IP Office

(57) ABSTRACT

A display panel having a pixel region and a sensing region includes a first substrate, a second substrate and a display medium layer. A plurality of pixel structures and at least one photo-voltaic cell device are disposed on the first substrate. The pixel structures are arranged in the pixel region in array, and each of the pixel structures includes a thin film transistor and a pixel electrode electrically connected to the thin film transistor. The photo-voltaic cell device disposed in the sensing region includes a doped semiconductor layer, a transparent electrode layer, a first type doped silicon-rich dielectric layer and a second type doped silicon-rich dielectric layer. The first type doped silicon-rich dielectric layer and the second type doped silicon-rich dielectric layer are disposed between the doped semiconductor layer and the transparent electrode layer. The display medium layer is disposed between the first substrate and the second substrate.

17 Claims, 11 Drawing Sheets

THIN FILM TRANSISTOR ARRAY SUBSTRATE, DISPLAY PANEL, LIQUID CRYSTAL DISPLAY APPARATUS AND MANUFACTURING METHOD THEREOF

CROSS-REFERENCE TO RELATED APPLICATION

This application claims the priority benefit of Taiwan application serial no. 98120091, filed on Jun. 16, 2009. The entirety of the above-mentioned patent application is hereby incorporated by reference herein and made a part of specification.

BACKGROUND OF THE INVENTION

1. Field of the Invention

The present invention relates to an array substrate, a display apparatus and a manufacturing method thereof, and more particularly to a thin film transistor array substrate, a display panel, a liquid crystal display apparatus and a manufacturing method thereof.

2. Description of Related Art

In general, a photo-voltaic cell device is often made of silicon or group III-V semiconductors. After the photo-voltaic cell device is irradiated, free electron-hole pairs are generated in a material layer of the photo-voltaic cell device, and charges are separated because of electric field effects, so as to form a semiconductor device having a voltage difference caused by the electric field effects. Operation principles of the photo-voltaic cell device are associated with the semiconductor energy band theory, conduction of carriers in semiconductor materials, P-N (positive-negative type) diode properties, and so on.

FIG. 1 is a schematic structural view of a conventional photo-voltaic cell device. Referring to FIG. 1, the conventional photo-voltaic cell device 100 includes a first electrode 110, a P-type semiconductor layer 120 such as a P-type silicon layer, an N-type semiconductor layer 130 such as an N-type silicon layer, and a second electrode 140. The P-type silicon layer 120 is disposed on the first electrode 110, and the N-type silicon layer 130 is disposed on the P-type silicon layer 120. The second electrode 140 is disposed on the N-type silicon layer 130.

Normally, the P-type silicon layer 120 and the N-type silicon layer 130 are made of a silicon material doped with a dopant, such as an amorphous silicon layer or a doped polysilicon layer. A so-called P/N junction or a depletion region is formed at a junction of the P-type silicon layer 120 and the N-type silicon layer 130. Therefore, when the depletion region or the P-type and N-type silicon layers 120 and 130 are irradiated, the energy from the light results in separation of positive and negative charges in the depletion region; namely, additional free electron-hole pairs are generated. The positive charges $h^+$ (holes) and the negative charges $e^-$ (electrons) are seperated and respectively moved towards the positive doped layer (the P-type silicon layer 120) and the negative doped layer (the N-type silicon layer 130) and aggregate. As such, when a load circuit is connected to the first electrode 110 and the second electrode 140, a photo-voltaic current is introduced to drive the load circuit.

Nonetheless, the photo-voltaic cell device mainly made of silicon (e.g. a silicon photo-voltaic cell device or a polysilicon photo-voltaic cell device) has a photo-voltaic conversion efficiency at approximately 15% in average. The silicon photo-voltaic cell device is easily to be decayed by the sunlight or external thermal energy due to silicon recrystalline or rearrangement. As a result, how to develop a novel type of film layer material for improving the photo-voltaic conversion efficiency and lifetime of the photo-voltaic cell device has always attracted people's attention.

SUMMARY OF THE INVENTION

The present invention is directed to a display panel, which has a photo-voltaic cell device capable of receiving light from dual sides, so as to receive light from both sides of the panel.

The present invention is directed to a liquid crystal display (LCD) panel, which also has the aforementioned photo-voltaic cell device, and accordingly has a same feature as that of the aforementioned display panel.

The present invention is directed to a thin film transistor array substrate, which also has the aforementioned photo-voltaic cell device, and accordingly has a same feature as that of the aforementioned display panel.

The present invention is directed to a method of manufacturing a display panel, by which besides the aforementioned photo-voltaic cell device is fabricated, a fabrication process for fabricating the photo-voltaic cell device on the display panel is also simplified.

The present invention provides a display panel having a pixel region and a sensing region. The display panel includes a first substrate, a second substrate and a display medium layer. A plurality of pixel structures are disposed on the first substrate. The pixel structures are arranged in the pixel region in an array, and each of the pixel structures includes a thin film transistor and a pixel electrode electrically connected to the thin film transistor. The thin film transistor includes a gate electrode, a gate insulator layer and an active layer. At least one photo-voltaic cell device is disposed on the sensing region of the substrate, and the photo-voltaic cell device includes a doped semiconductor layer, a transparent electrode layer, a first type doped silicon-rich dielectric layer and a second type doped silicon-rich dielectric layer. The first type doped silicon-rich dielectric layer is doped with a first type ion, and the second type doped silicon-rich dielectric layer is doped with a second type ion. The first type doped silicon-rich dielectric layer and the second type doped silicon-rich dielectric layer are disposed between the doped semiconductor layer and the transparent electrode layer. The second substrate is disposed opposite to the first substrate. The display medium layer is disposed between the first substrate and the second substrate.

The present invention provides an LCD apparatus including an LCD panel and a backlight module. The LCD panel has a pixel region and a sensing region. The LCD panel includes a first substrate, a second substrate and a liquid crystal layer. The second substrate is disposed opposite to the first substrate, and the liquid crystal layer is disposed between the first substrate and the second substrate. A plurality of pixel structures are disposed on the first substrate. The pixel structures are arranged in the pixel region in an array, and each of the pixel structures includes a thin film transistor and a pixel electrode electrically connected to the thin film transistor. The thin film transistor includes a gate electrode, a gate insulator layer and an active layer. At least one photo-voltaic cell device is disposed on the sensing region of the substrate, and the photo-voltaic cell device includes a doped semiconductor layer, a transparent electrode layer, a first type doped silicon-rich dielectric layer and a second type doped silicon-rich dielectric layer. The first type doped silicon-rich dielectric layer is doped with a first type ion, and the second type doped silicon-rich dielectric layer is doped with a second type ion. The first type doped silicon-rich dielectric layer and the second type doped silicon-rich dielectric layer are disposed between the doped semiconductor layer and the transparent electrode layer. The backlight module is disposed at a side of the LCD panel, and is located adjacent to the first substrate to provide a light source to the LCD panel.

The present invention provides a thin film transistor array substrate including a substrate, a plurality of pixel structures and at least one photo-voltaic cell device. The substrate has a pixel region and a sensing region. The pixel structures are arranged in the pixel region of the substrate in an array, and each of the pixel structures includes a thin film transistor and a pixel electrode electrically connected to the thin film transistor. The thin film transistor includes a gate electrode, a gate insulator layer and an active layer. The photo-voltaic cell device is disposed on the sensing region of the substrate, and includes a doped semiconductor layer, a transparent electrode layer, a first type doped silicon-rich dielectric layer and a second type doped silicon-rich dielectric layer. The first type doped silicon-rich dielectric layer is doped with a first type ion, and the second type doped silicon-rich dielectric layer is doped with a second type ion. The first type doped silicon-rich dielectric layer and the second type doped silicon-rich dielectric layer are disposed between the doped semiconductor layer and the transparent electrode layer.

In an embodiment of the present invention, the thin film transistor includes a low temperature polysilicon thin film transistor (LTPS TFT).

In an embodiment of the present invention, the active layer includes a source doped region, a drain doped region and a channel region located between the source doped region and the drain doped region.

In an embodiment of the present invention, a material of the source doped region or the drain doped region is the same to a material of the doped semiconductor layer.

In an embodiment of the present invention, the active layer and the doped semiconductor layer of the photo-voltaic cell device are in the same layer.

In an embodiment of the present invention, the pixel electrode of the pixel structure and the transparent electrode layer of the photo-voltaic cell device are in the same layer.

In an embodiment of the present invention, the thin film transistor array substrate, the display panel or the LCD apparatus further includes an intrinsic layer disposed between the first type doped silicon-rich dielectric layer and the second type doped silicon-rich dielectric layer.

In an embodiment of the present invention, a material of the intrinsic layer includes amorphous silicon, polysilicon, silicon-rich dielectric layer or a combination thereof.

In an embodiment of the present invention, the silicon-rich dielectric layer includes a silicon-rich silicon oxide layer, a silicon-rich silicon nitride layer, a silicon-rich silicon oxynitride layer, a silicon-rich silicon carbide layer, or a combination thereof.

In an embodiment of the present invention, the first type doped silicon-rich dielectric layer and the second type doped silicon-rich dielectric layer further include silicon nanoparticles.

In an embodiment of the present invention, the first type doped silicon-rich dielectric layer includes an N-type doped silicon-rich dielectric layer, and the second type doped silicon-rich dielectric layer includes a P-type doped silicon-rich dielectric layer.

In an embodiment of the present invention, the thin film transistor array substrate, the display panel or the LCD apparatus further includes a peripheral circuit region located aside the pixel region. A peripheral circuit is disposed on the first substrate, and is located in the peripheral circuit region.

The present invention provides a method for manufacturing a display panel, wherein the display panel has a pixel region and a sensing region. The method for manufacturing the display panel includes following steps. First, a first substrate is provided. Next, a patterned semiconductor layer is formed on the first substrate, wherein the patterned semiconductor layer includes a first semiconductor block located in the pixel region and a second semiconductor block located in the sensing region. Next, an ion doping process is performed to the first semiconductor block and the second semiconductor block to form a source doped region, a drain doped region and a channel region that is located between the source doped region and the drain doped region in the first semiconductor block, and simultaneously form a doped semiconductor layer in the second semiconductor block. Next, a gate insulator layer is formed on the first substrate to cover the first semiconductor block and the doped semiconductor layer. Next, a first patterned metal layer is formed on the gate insulator layer, wherein the first patterned metal layer includes a gate electrode corresponding to the channel region. Next, an inter-layer dielectric layer is formed on the gate insulator layer to cover the first patterned metal layer. Next, a plurality of first via holes and a first opening are formed in the inter-layer dielectric layer and the gate insulator layer, wherein the first via holes respectively expose the corresponding source doped region and the drain doped region, and the first opening exposes the doped semiconductor layer. Next, a second patterned metal layer is formed on the inter-layer dielectric layer and is filled in the first via holes, so as to electrically connect the source doped region and the drain doped region. Next, a first type doped silicon-rich dielectric layer is formed on the doped semiconductor layer. Next, a second type doped silicon-rich dielectric layer is formed on the first type doped silicon-rich dielectric layer. Next, a passivation layer is formed on the substrate to cover the inter-layer dielectric layer, the second patterned metal layer and the second type doped silicon-rich dielectric layer. Next, a plurality of second via holes and a second opening are formed in the passivation layer, wherein the second via holes respectively expose the corresponding second patterned metal layer, and the second opening exposes the second type doped silicon-rich dielectric layer. Next, a patterned transparent conductive layer is formed on the passivation layer, and is filled in the second via holes and the second opening, so as to respectively form a plurality of pixel electrodes on the pixel region and a transparent electrode layer on the second type doped silicon-rich dielectric layer. Next, a second substrate is assembled to the first substrate, and a display medium layer is disposed between the first substrate and the second substrate.

The present invention provides a method for manufacturing a display panel, wherein the display panel has a pixel region and a sensing region. The method for manufacturing the display panel includes following steps. First, a first substrate is provided. Next, a plurality of pixel structures located at the pixel region and at least one photo-voltaic cell device located at the sensing region are formed on the first substrate, wherein each of the pixel structures includes a thin film transistor and a pixel electrode electrically connected to the thin film transistor, and the photo-voltaic cell device includes a doped semiconductor layer, a transparent electrode layer, a first type doped silicon-rich dielectric layer and a second type doped silicon-rich dielectric layer. Wherein, a method of forming the pixel structures and the photo-voltaic cell device includes following steps. First, an active layer of each of the thin film transistors and the doped semiconductor layer of the photo-voltaic cell device are simultaneously formed on the first substrate. Next, the pixel electrode and the transparent electrode layer of the photo-voltaic cell device are simultaneously formed on the first substrate. Next, a second substrate is assembled to the first substrate, and a display medium layer is disposed between the first substrate and the second substrate.

In an embodiment of the present invention, the ion doping process performed to the second semiconductor block includes a P-type ion doping and an N-type ion doping.

In an embodiment of the present invention, a method of forming the first type doped silicon-rich dielectric layer and the second type doped silicon-rich dielectric layer includes performing a chemical vapor deposition process.

In an embodiment of the present invention, a method of fabricating the display panel includes performing an excimer laser annealing process, so as to form silicon nanoparticles in the first type doped silicon-rich dielectric layer and the second type doped silicon-rich dielectric layer.

In an embodiment of the present invention, the step of performing the ion doping process to the first semiconductor block is performed after the step of forming the first patterned metal layer, by which the gate electrode is taken as a mask to perform the ion doping to the exposed source doped region and the drain doped region.

In the present invention, when the active layer of the thin film transistor is formed, the doped semiconductor layer of the photo-voltaic cell device is simultaneously formed, wherein the doped semiconductor layer can be regarded as a first electrode of the photo-voltaic cell device. Moreover, when the pixel electrode of the pixel structure is fabricated, the transparent electrode layer of the photo-voltaic cell device is simultaneously formed, wherein the transparent electrode layer can be regarded as a second electrode of the photo-voltaic cell device. By such means, a fabrication process for fabricating the photo-voltaic cell device on the display panel is simplified. Moreover, since the doped semiconductor layer is taken as the first electrode of the photo-voltaic cell device, the light can not only penetrate through the transparent electrode layer to reach internal of the photo-voltaic cell device, but can also penetrate through the doped semiconductor layer (the first electrode) and reach a photosensitive dielectric layer in the internal of the photo-voltaic cell device, so that the light energy can be converted into the electric energy, so as to supply a part of the electric energy required by the display panel. In other words, the photo-voltaic cell device of the display panel of the present invention is a solar cell structure capable of receiving light from both sides.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
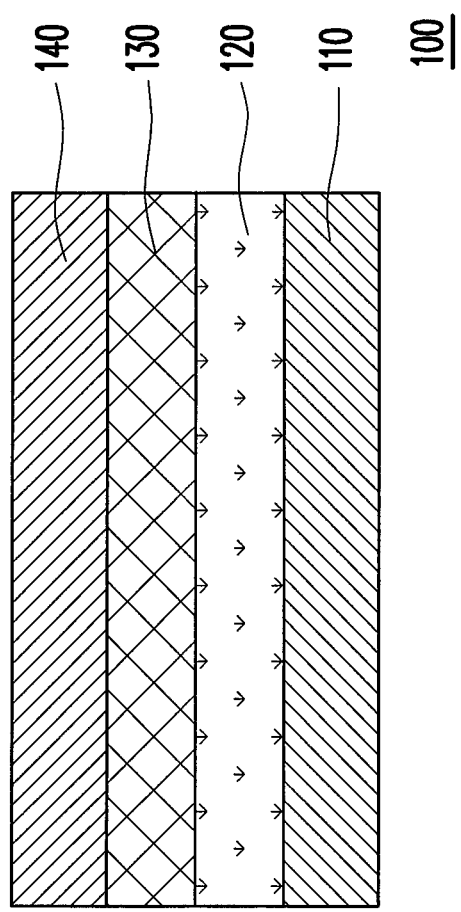
FIG. 1 is a structural diagram of a conventional photo-voltaic cell device.
Figure 2A:
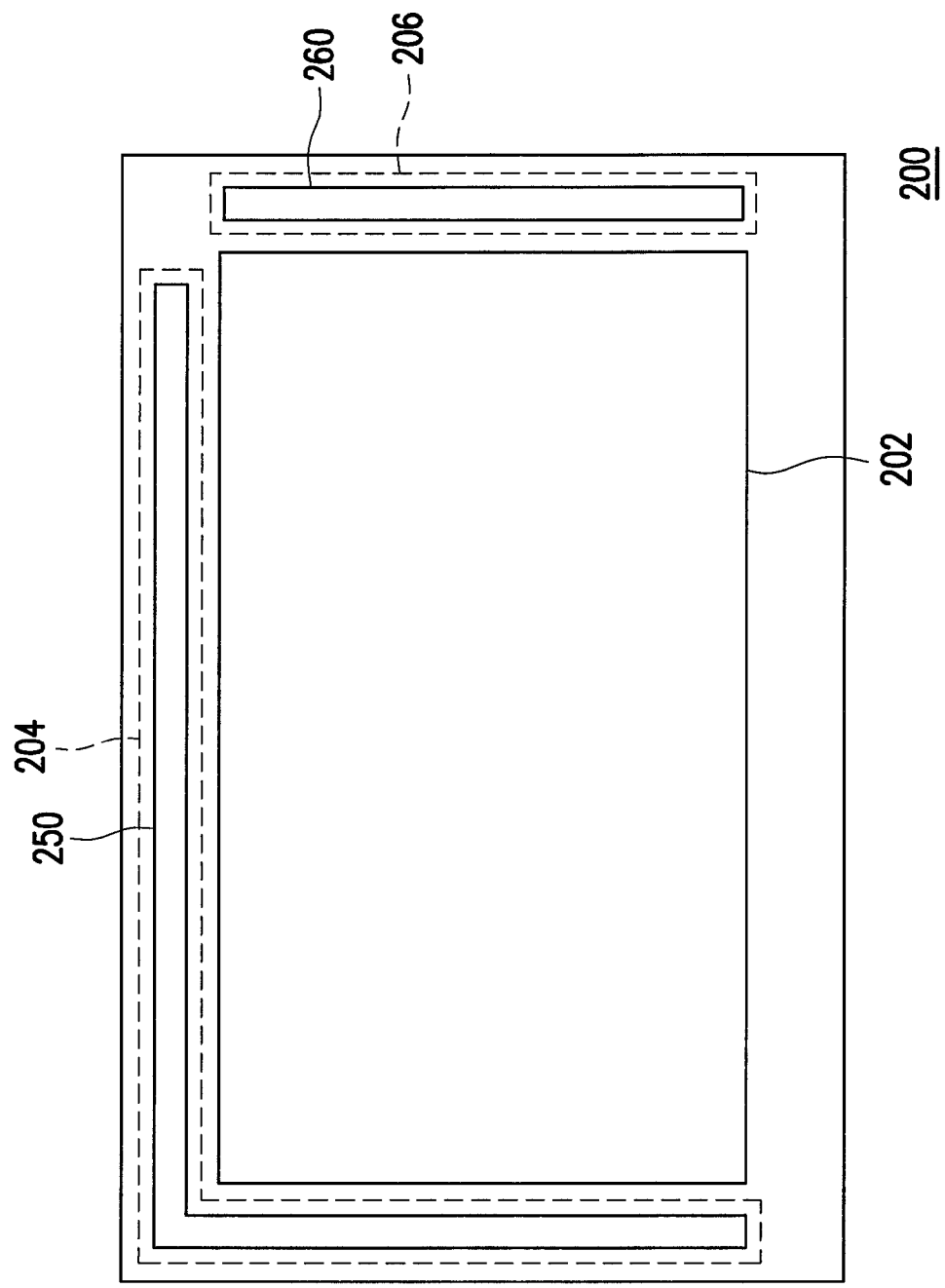
FIG. 2A is a top view of a display panel according to an embodiment of the present invention.
Figure 2B:
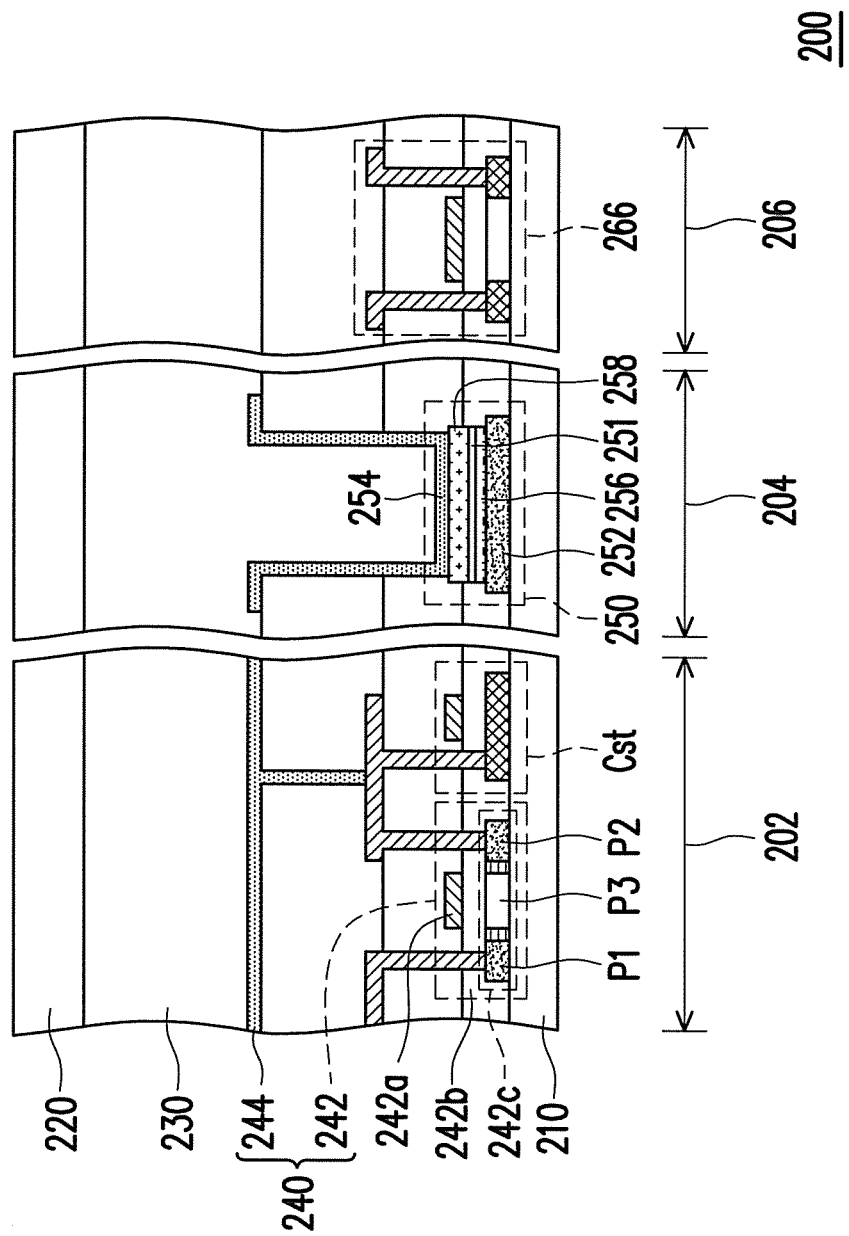
FIG. 2B is a partial cross-sectional view of a pixel region, a sensing region and a peripheral circuit region of FIG. 2A.
Figure 2C:
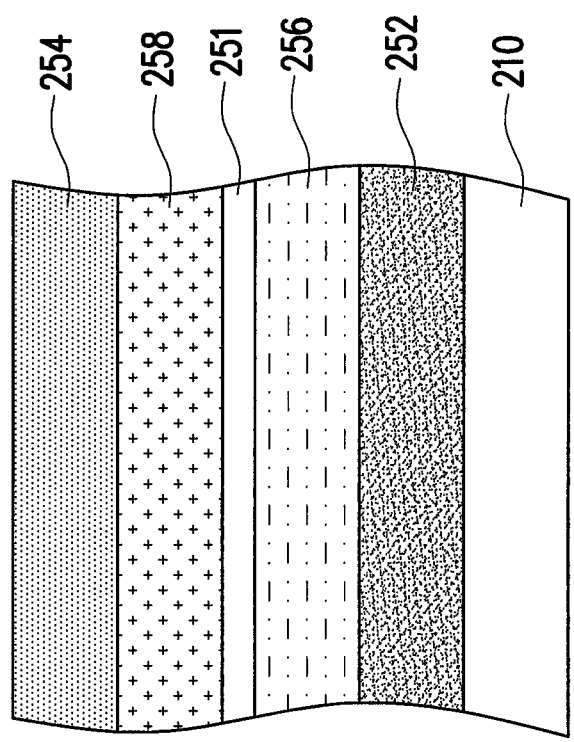
FIG. 2C is a partial amplified diagram of a sensing region of FIG. 2B.

FIG. 2A is a top view of a display panel according to an embodiment of the present invention, FIG. 2B is a partial cross-sectional view of a pixel region, a sensing region and a peripheral circuit region of FIG. 2A, and FIG. 2C is a partial amplified diagram of the sensing region of FIG. 2B. Referring to FIG. 2A, FIG. 2B and FIG. 2C, the display panel 200 of the present embodiment has a pixel region 202 and a sensing region 204, and the display panel 200 includes a first substrate 210, a second substrate 220 and a display medium layer 230.

A plurality of pixel structures 240 and at least one photo-voltaic cell device 250 are disposed on the first substrate 210. The pixel structures 240 are arranged in the pixel region 202 in an array, and each of the pixel structures 240 includes a thin film transistor 242 and a pixel electrode 244 electrically connected to the thin film transistor 242, as that shown in FIG. 2B. The thin film transistor 242 includes a gate electrode 242a, a gate insulator layer 242b and an active layer 242c. In the present embodiment, the thin film transistor 242 shown in FIG. 2B is, for example, a low temperature polysilicon thin film transistor (LTPS TFT) (which is referred to as a top gate thin film transistor). Moreover, the active layer 242c includes a source doped region P1, a drain doped region P2 and a channel region P3, wherein the channel region P3 is located between the source doped region P1 and the drain doped region P2. In another embodiment that is not illustrated, the thin film transistor 242 can also be a film structure of an amorphous silicon thin film transistor ($\alpha$-TFT) (which can be referred to as a bottom gate thin film transistor). In the present embodiment, the thin film transistor 242 is the LTPS TFT, though the present invention is not limited thereto.

The photo-voltaic cell device 250, i.e. a transparent photo-voltaic cell device, is disposed in the sensing region 204, and the photo-voltaic cell device 250 includes a doped semiconductor layer 252, a transparent electrode layer, 254 a first type doped silicon-rich dielectric layer 256 and a second type doped silicon-rich dielectric layer 258, as that shown in FIG. 2B. The first type doped silicon-rich dielectric layer 256 is doped with a first type ion, and the second type doped silicon-rich dielectric layer 258 is doped with a second type ion. The first type doped silicon-rich dielectric layer 256 and the second type doped silicon-rich dielectric layer 258 are disposed between the doped semiconductor layer 252 and the transparent electrode layer 254. In the present embodiment, a material of the first type doped silicon-rich dielectric layer 256 and the second type doped silicon-rich dielectric layer 258 is, for example, one of the following materials that contains silicon content more than a normal stoichiometry, such as, silicon rich oxide ($SiO_x$), silicon rich nitride ($SiN_y$), silicon rich oxynitride ($SiO_xN_y$), silicon rich carbide ($SiC_z$), silicon rich $SiH_wO_x$, silicon rich $SiH_wO_y$, silicon rich $SiH_wO_xN_y$, or a combination thereof, or other dielectric layers that contains the silicon content more than the normal stoichiometry, wherein $0<w<4$, $0<x<2$, $0<y<1.34$, $0<z<1$, though it is only an example, and the present invention is not limited thereto.

If the aforementioned silicon-rich dielectric layer is doped with the first type ion or the second type ion, the aforementioned first type doped silicon-rich dielectric layer 256 or the second type doped silicon-rich dielectric layer 258 is formed, wherein one of the first type ion and the second type ion includes VA group elements, such as nitrogen, phosphorus, arsenic, antimony or bismuth, etc., and another one of the first type ion and the second type ion includes IIIA group elements, such as boron, aluminium, gallium, indium or thallium, etc. In other words, the first type doped silicon-rich dielectric layer 256 can be an N-type doped silicon-rich dielectric layer, and the second type doped silicon-rich dielectric layer 258 can be a P-type doped silicon-rich dielectric layer, or the first type doped silicon-rich dielectric layer 256 can be the P-type doped silicon-rich dielectric layer, and the second type doped silicon-rich dielectric layer 258 can be the N-type doped silicon-rich dielectric layer, which are determined according to the first type ion and the second type ion doped to the silicon-rich dielectric layer.

In the present embodiment, the silicon-rich dielectric layer can be regarded as a photosensitive dielectric layer. In detail, when the light irradiates at least one of the first type doped silicon-rich dielectric layer 256 and the second type doped silicon-rich dielectric layer 258, the first type doped silicon-rich dielectric layer 256 and the second type doped silicon-rich dielectric layer 258 irradiated by the light generate free electron-hole pairs, and the electrons and the holes respectively move towards an inner electric field formed between the first type doped silicon-rich dielectric layer 256 and the second type doped silicon-rich dielectric layer 258. Moreover, since the doped semiconductor layer 252 is electrically connected to the first type doped silicon-rich dielectric layer 256, and the transparent electrode layer 254 is electrically connected to the second type doped silicon-rich dielectric layer 258, if the doped semiconductor layer 252 and the transparent electrode layer 254 are coupled to a load, a photocurrent can be generated to work on the load, wherein the photocurrent can be varied along with a light intensity of the light irradiated on the photo-voltaic cell device 250.

Moreover, the photo-voltaic cell device 250 illustrated in FIG. 2A is arranged in an L-shape, which can be formed by a plurality of the photo-voltaic cell devices 250 connected in serial, or can be one L-shape photo-voltaic cell device 250 having a large area. Certainly, an arrangement shape and a position of the photo-voltaic cell device 250 illustrated in FIG. 2A is only used as an example, and the photo-voltaic cell device 250 can also be disposed around the pixel region 202. Moreover, a quantity and a coupling relation of the photo-voltaic cell devices 250 are determined according to a voltage or a current required by the display panel 200.

For example, if a driving voltage required in the internal of the display panel 200 is 3V, and if a voltage provided by each of the photo-voltaic cell devices 250 after the photo sensing thereof is 0.3V, ten photo-voltaic cell devices 250 can be coupled in serial to provide the driving voltage required by the display panel 200. A principle of the serial coupling method of the photo-voltaic cell devices 250 is similar to that of a serial coupling method of general cell devices. Therefore, those with ordinary skill in the art can understand a voltage addition effect formed by connecting the photo-voltaic cell devices 250 in serial, and the related principle thereof is not repeated herein. Certainly, the photo-voltaic cell devices 250 can also be electrically connected in parallel, so that the photocurrent provided by each of the photo-voltaic cell devices 250 after the photo sensing thereof can be added to form a relatively great current for driving the display panel 200. In detail, if a driving current required by an internal circuit of the display panel 200 is 3 A (ampere), and if the photocurrent provided by each of the photo-voltaic cell devices 250 after the photo sensing thereof is 0.3 A, ten photo-voltaic cell devices 250 can be coupled in parallel to provide the driving current required by the display panel 200, wherein a principle of the parallel coupling method of the photo-voltaic cell devices 250 is similar to that of a parallel coupling method of general cell devices. In other words, those with ordinary skill in the art can understand a current addition effect formed by connecting the photo-voltaic cell devices 250 in parallel, and the related principle thereof is not repeated herein.

In the present embodiment, the display panel 200 further includes an intrinsic layer 251 disposed between the first type doped silicon-rich dielectric layer 256 and the second type doped silicon-rich dielectric layer 258, as that shown in FIG. 2B or FIG. 2C. In detail, a material of the intrinsic layer 251 is, for example, silicon-rich dielectric layer, amorphous silicon, polysilicon, or a combination thereof, and preferably is undoped amorphous silicon, undoped polysilicon, and undoped silicon-rich dielectric layer. Wherein, the silicon-rich dielectric layer can be silicon-rich silicon oxide layer, silicon-rich silicon nitride layer, silicon-rich silicon oxynitride layer, silicon-rich silicon carbide layer, or a combination thereof.

In other words, when the photo-voltaic cell device 250 is irradiated by the light, besides the first type doped silicon-rich dielectric layer 256 and the second type doped silicon-rich dielectric layer 258 can generate the free electron-hole pairs, the intrinsic layer 251 can also generate the free electron-hole pairs. Similarly, the electrons and the holes are also attracted by the inner electric field between the first type doped silicon-rich dielectric layer 256 and the second type doped silicon-rich dielectric layer 258, so that a potential difference is generated between the doped semiconductor layer 252 and the transparent electrode layer 254. Moreover, since the intrinsic layer 251 can also generate the free electron-hole pairs after being irradiated by the light, the photo-voltaic cell device 250 can generate more free electron-hole pairs, so that a quantity of the electrodes and the holes gathered at the doped semiconductor layer 252 and the transparent electrode layer 254 can be increased, and accordingly the photoelectric conversion efficiency of the photo-voltaic cell device 250 is improved.

In the present embodiment, the first type doped silicon-rich dielectric layer 256 and the second type doped silicon-rich dielectric layer 258 further contian silicon nanoparticles, wherein a particle diameter of the silicon nanoparticles is between 0.5-200 nm (nanometer). Now, the first type doped silicon-rich dielectric layer 256 and the second type doped silicon-rich dielectric layer 258 may have a relatively thin thickness (for example, 100-500 nm) to provide an enough photoelectric conversion efficiency. In other words, when the light irradiates the photo-voltaic cell device 250, the photo-voltaic cell device 250 has a better photoelectric conversion efficiency. It should be noticed that the photo-voltaic cell device 250 can already provide the better photoelectric conversion efficiency in case that the first type doped silicon-rich dielectric layer 256 and the second type doped silicon-rich dielectric layer 258 do not contain the aforementioned silicon nanoparticles. Namely, if the first type doped silicon-rich dielectric layer 256 and the second type doped silicon-rich dielectric layer 258 contain the silicon nanoparticles, the photoelectric conversion efficiency of the photo-voltaic cell device 250 can be further improved. Moreover, regarding the first type doped silicon-rich dielectric layer 256 and the second type doped silicon-rich dielectric layer 258, the photosensitive silicon elements are inlaid to the silicon-rich dielectric layer ($SiO_x$, $SiN_y$, $SiO_xN_y$, $SiC_z$, or $SiO_xC_z$), wherein $0<x<2$, $0<y<1.34$, and $0<z<1$, though it is only an example, and the present invention is not limited thereto. Therefore, the first type doped silicon-rich dielectric layer 256 and the second type doped silicon-rich dielectric layer 258 may have a relatively high photoelectric stability, and a deterioration phenomenon thereof generated due to a long time utilization can be avoided.

Referring to FIG. 2B and FIG. 2C, in the present embodiment, the material of one of the source doped region P1 and the drain doped region P2 of the active layer 242c is the same to the material of the doped semiconductor layer 252. Namely, the doped semiconductor layer 252 can be simultaneously fabricated along with the source doped region P1 or the drain doped region P2. Therefore, the doped semiconductor layer 252 can be a P-type doped semiconductor layer or an N-type doped semiconductor layer. In other words, the active layer 242c of the thin film transistor 242 and the doped semiconductor layer 252 of the photo-voltaic cell device 250 are belonged to the same layer. In another embodiment that is not illustrated, if the thin film transistor 242 is an amorphous silicon thin film transistor, when an active layer of the amorphous silicon thin film transistor is fabricated, the doped semiconductor layer of the photo-voltaic cell device 250 can be simultaneously fabricated.

In addition, in the present embodiment, the pixel electrode 244 of the pixel structure 240 and the transparent electrode layer 254 of the photo-voltaic cell device 250 are belonged to the same layer, as that shown in FIG. 2B and FIG. 2C. Namely, when the layer of the pixel electrode 244 of the pixel structure 240 is formed, the transparent electrode layer 254 of the photo-voltaic cell device 250 can be simultaneously formed.

Moreover, the second substrate 220 is disposed opposite to the first substrate 210, and the display medium layer 230 is disposed between the first substrate 210 and the second substrate 220. In the present embodiment, a color filter (not shown) is further disposed on one of the second substrate 220 and the first substrate 210. For example, when the color filter is disposed on the first substrate 210, a film design thereof can be color filter on array or array on color filter, or other suitable configuration methods. In the present embodiment, the color filter is formed on the second substrate 220 to form a color filter substrate. Certainly, whether the color filter is formed on the first substrate 210 or the second substrate 220 is determined according to a demand of the user, which is not limited by the present invention. Moreover, the display medium layer 230 is, for example, a liquid crystal layer.

In the present embodiment, the display panel 200 further includes a peripheral circuit region 206 located aside the pixel region 202, wherein a peripheral circuit is disposed on the first substrate 210, and is located in the peripheral circuit region 206. In detail, the peripheral circuit 260 is formed by, for example, a plurality of active devices 266, wherein the active devices 266 are, for example, the P-type thin film transistors, the N-type thin film transistors, or complementary metal oxide semiconductor (CMOS) transistors, which are used for driving the display panel 200, as that shown in FIG. 2A and FIG. 2B. Moreover, the display panel 200 further includes an electric energy storage device (not shown) disposed in the peripheral circuit region 206, which is electrically connected to the photo-voltaic cell device 250. In detail, the electric energy storage device is mainly used for storing the electric energy converted by the photo-voltaic cell device 250, so as to continually provide the electric energy to the display panel 200 in case of a low light irradiation or no light irradiation.

According to the above descriptions, in the display panel 200 of the present embodiment, when the active layer 242c of the thin film transistor 242 is formed, the doped semiconductor layer 252 of the photo-voltaic cell device 250 is simultaneously formed, wherein the doped semiconductor layer 252 can be regarded as a first electrode of the photo-voltaic cell device 250. Moreover, when the pixel electrode 244 of the pixel structure 240 is fabricated, the transparent electrode layer 254 of the photo-voltaic cell device 250 is also simultaneously fabricated, wherein the transparent electrode layer 254 can be regarded as a second electrode of the photo-voltaic cell device 250. By such means, a fabrication process for fabricating the photo-voltaic cell device 250 on the display panel 200 is simplified. Moreover, since the doped semiconductor layer 252 serves as the first electrode of the photo-voltaic cell device 250, the light can not only penetrate through the transparent electrode layer 254 to reach the internal of the photo-voltaic cell device 250, but can also penetrate through the first electrode and reach a photosensitive dielectric layer in the internal of the photo-voltaic cell device 250, so that the light energy can be converted into the electric energy for utilization. In other words, the photo-voltaic cell device 250 of the display panel 200 of the present embodiment is a solar cell structure capable of receiving the light from both sides.

Moreover, the present invention also provides a method for manufacturing the aforementioned display panel 200. For simplicity's sake, only the method of forming the pixel structures 240 on the pixel region 202 and the method of forming the photo-voltaic cell devices 250 on the sensing region 204 are described according to the figures, and the method of forming the active devices 266 on the peripheral circuit region 206 is known by those with ordinary skill in the art, and therefore description thereof is not repeated.

Figure 3A:
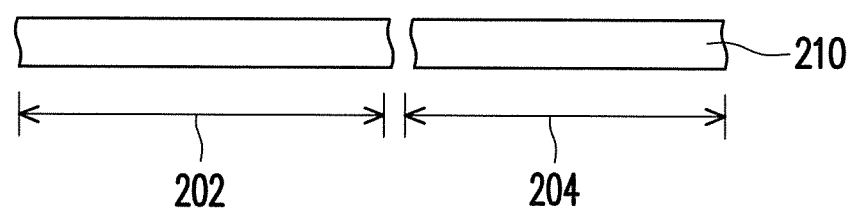
FIGS. 3A-3L are diagrams illustrating a fabrication process of a display panel according to an embodiment of the present invention.

FIGS. 3A-3L are diagrams illustrating a fabrication process of a display panel according to an embodiment of the present invention. Referring to FIG. 3A, first, the first substrate 210 is provided. A material of the first substrate 210 can be an inorganic transparent material or an organic transparent material, wherein the inorganic transparent material is, for example, glass or quartz, and the organic transparent material is, for example, polyolefin, polyamide, polyglycol, polyester, rubber, thermoplastic polymer, thermosetting polymer, polyaromatics, poly methyl methacrylate, polycarbonate ester, or other suitable materials, or derivatives thereof or a combination thereof. In the present embodiment, the material of the first substrate 210 is glass, though the present invention is not limited thereto.

Figure 3B:
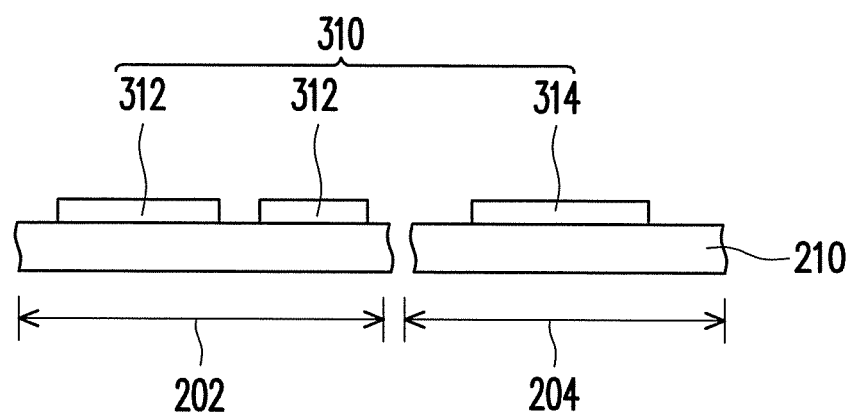

Next, a patterned semiconductor layer 310 is formed on the first substrate 210, wherein the patterned semiconductor layer 310 includes a first semiconductor block 312 in the pixel region 202 and a second semiconductor block 314 in the sensing region 204, as that shown in FIG. 3B. In the present embodiment, the patterned semiconductor layer 310 is formed based on, for example, a conventional photolithography and etching process (PEP). For example, a semiconductor material layer (not shown) can be fully formed first, and then the PEP is performed to pattern the semiconductor material layer to form the patterned semiconductor layer 310.

Figure 3C:
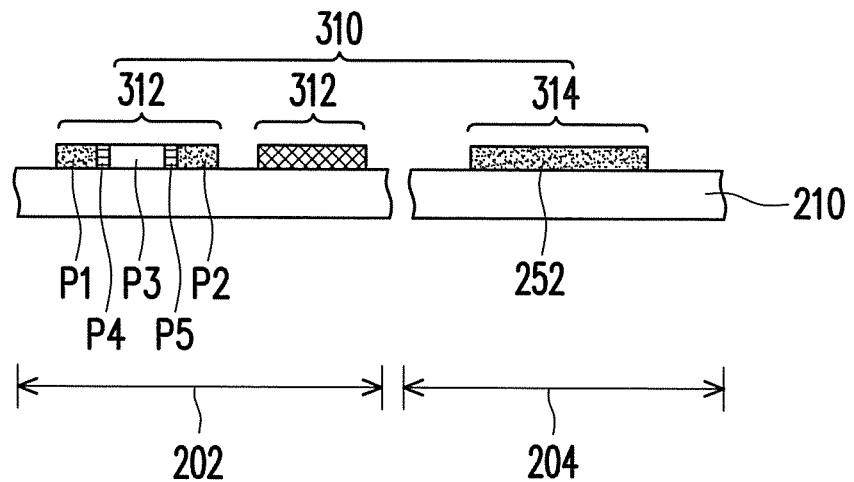

Next, an ion doping process is performed to the first semiconductor block 312 and the second semiconductor block 314 to form the source doped region P1, the drain doped region P2 and the channel region P3 located between the source doped region P1 and the drain doped region P2 in the first semiconductor block 312, and simultaneously form the doped semiconductor layer 252 in the second semiconductor block 314, as that shown in FIG. 3C. In the present embodiment, the ion doped to the first semiconductor block 312 and the second semiconductor block 314 is, for example, the aforementioned first type ion or the second type ion, and a doping method thereof is, for example, ion implant, i.e. the ion doping performed to the second semiconductor block 314 includes a P-type ion doping or an N-type ion doping. In an embodiment, the ion doping process can further be performed to an area between the source doped region P1 and the channel region P3 of the pixel region 202, and an area between the drain doped region P2 and the channel region P3 of the pixel region 202 to respectively form a source lightly-doped region P4 and drain lightly-doped region P5. Now, fabrication of the active layer 242c of the thin film transistor 242 is completed.

Figure 3D:
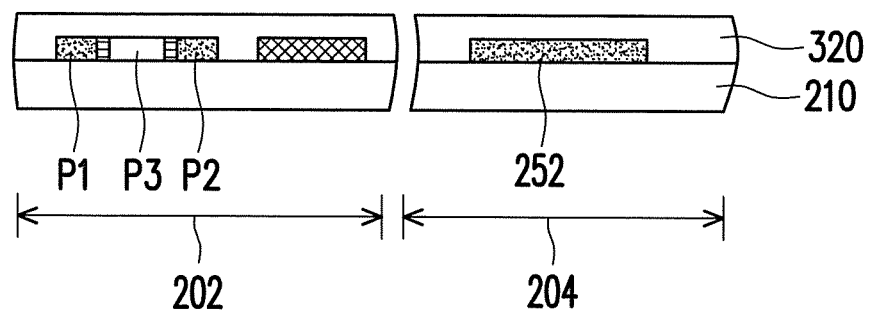

Next, a gate insulator layer 320 is formed on the first substrate 210 to cover the first semiconductor block 312 and the doped semiconductor layer 252, as that shown in FIG. 3D. In the present embodiment, the gate insulator layer 320 is formed based on a chemical vapor deposition process, though the present invention is not limited thereto, and other suitable methods such as screen printing, coating, inkjet printing and energy source processing, etc. can also be applied. Moreover, the gate insulator layer 320 can be a single layer structure or a multi-layer structure, and a material thereof is, for example, an inorganic material (such as, silicon oxide, silicon nitride, silicon oxynitride, silicon carbide, hafnium oxide, aluminium oxide, or other suitable materials, or a combination thereof), an inorganic material (such as photoresist, benzocyclobutene, cycloalkenes, polyimide, polyamide, polyester, polyol, oxypropylene, polystyrene, resin, polyether, polyketides, or other suitable materials or a combination thereof), or a combination thereof. In the present embodiment, the material of the gate insulator layer 320 is, for example, silicon dioxide or silicon nitride, though the present invention is not limited thereto.

Figure 3E:
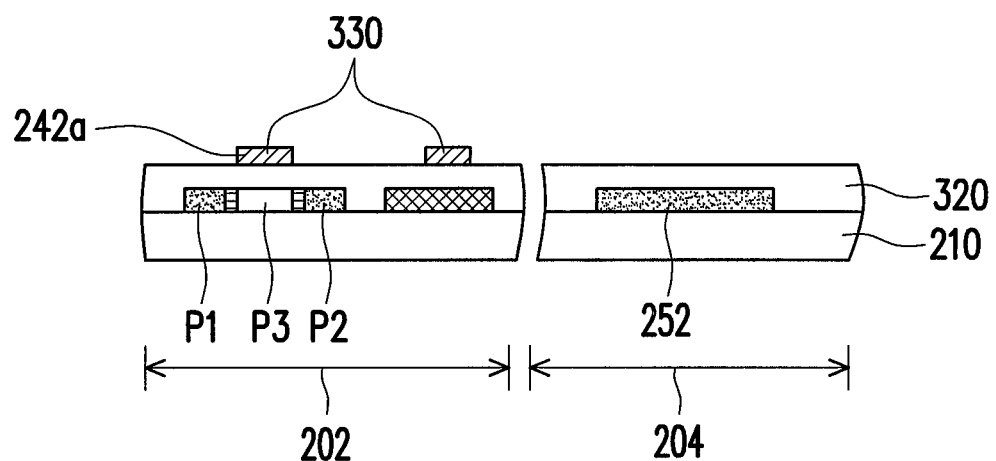

Next, a first patterned metal layer 330 is formed on the gate insulator layer 320, wherein the first patterned metal layer 330 includes a gate electrode 242a corresponding to the channel region P3, as that shown in FIG. 3E. In the present embodiment, a method of forming the first patterned metal layer 330 is, for example, the aforementioned PEP. For example, a metal material layer is fully formed on the gate insulator layer 320 first, and then the PEP is performed to pattern the metal material layer, so as to form the patterned metal layer 330, wherein a method of forming the metal material layer is, for example, a metal organic chemical vapor deposition (MOCVD) method.

Figure 3F:
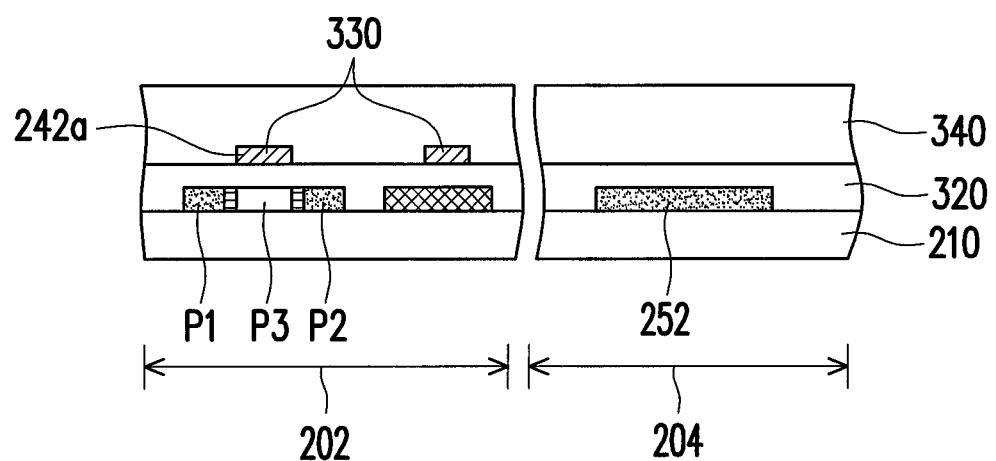

Next, an inter-layer dielectric layer 340 is formed on the gate insulator layer 320 to cover the first patterned metal layer 330, as that shown in FIG. 3F. In the present embodiment, a method of forming the inter-layer dielectric layer 340 is the same to the method of forming the gate insulator layer 320, and therefore detail description thereof is not repeated.

Figure 3G:
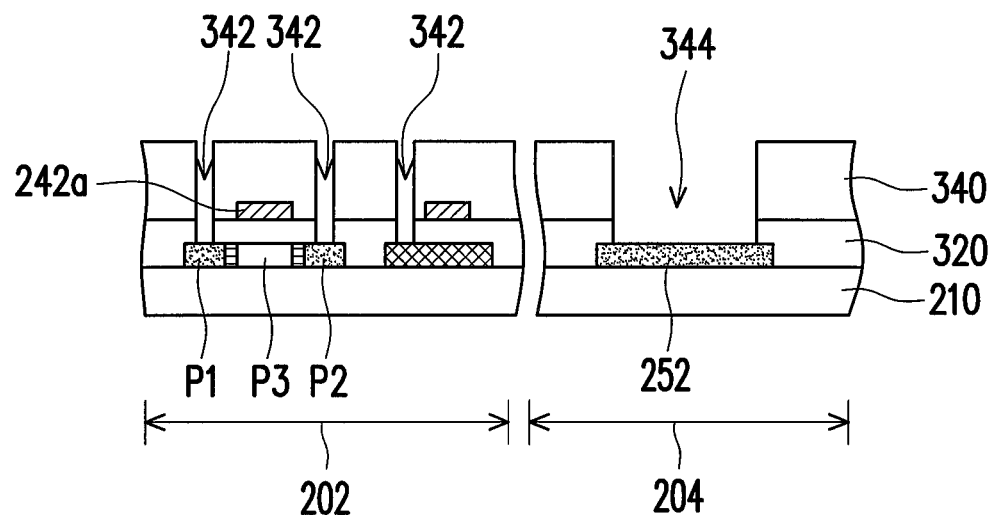

Thereafter, a plurality of first via holes 342 and a first opening 344 are formed in the inter-layer dielectric layer 340 and the gate insulator layer 320, wherein the first via holes 342 respectively expose the corresponding source doped region P1 and the drain doped region P2, and the first opening 344 exposes the doped semiconductor layer 252, as that shown in FIG. 3G. Wherein, the first via holes 342 and the first opening 344 are, for example, formed based on an etching process.

Figure 3H:
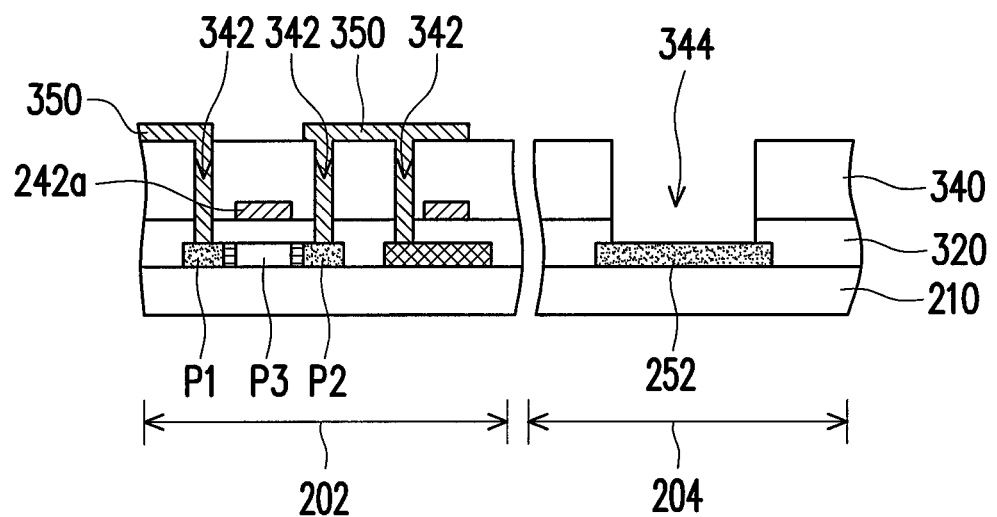

Next, a second patterned metal layer 350 is formed on the inter-layer dielectric layer 340 and is filled in the first via holes 342, so as to electrically connect the source doped region P1 and the drain doped region P2, respectively, as that shown in FIG. 3H. In the present embodiment, a method of forming the second patterned metal layer 350 is similar to the method of forming the first patterned metal layer 330, and therefore detail description thereof is not repeated.

Figure 3I:
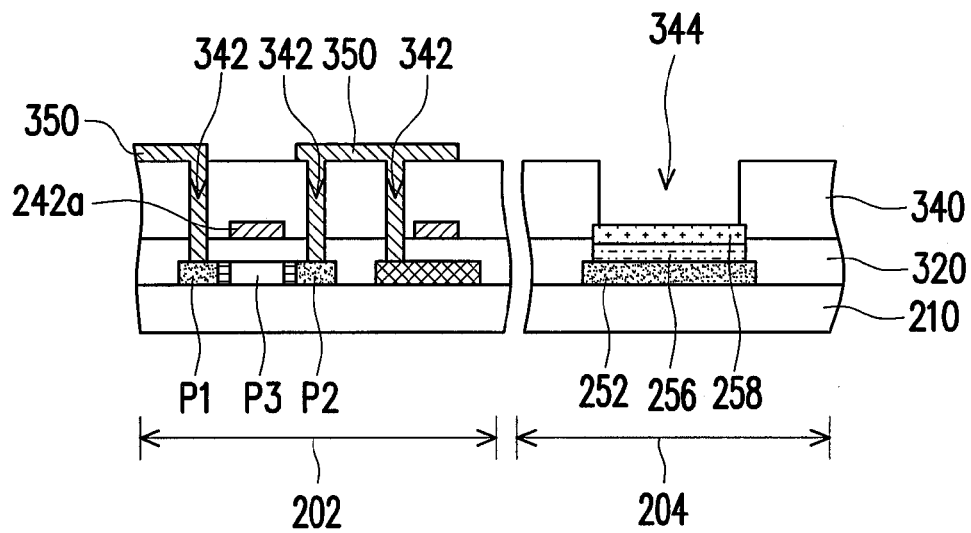

Thereafter, the first type doped silicon-rich dielectric layer 256 is formed on the doped semiconductor layer 252, and the second type doped silicon-rich dielectric layer 258 is formed on the first type doped silicon-rich dielectric layer 256, as that shown in FIG. 3I. In the present embodiment, the material of the first type doped silicon-rich dielectric layer 256 and the second type doped silicon-rich dielectric layer 258 is already described above, and therefore detail description thereof is not repeated. A method of forming the first type doped silicon-rich dielectric layer 256 and the second type doped silicon-rich dielectric layer 258 is, for example, the chemical vapor deposition process, and by controlling a gas ratio, an excessive amount of silicon content is achieved, so that the silicon content is more than a normal stoichiometry, so as to form a silicon-rich dielectric layer. Wherein, during the chemical vapor deposition process, a dopant (for example, the aforementioned first type ion and the second type ion) is input to form an N-type doped silicon-rich dielectric layer or a P-type doped silicon-rich dielectric layer.

In detail, regarding fabrication conditions of the N-type doped silicon-rich dielectric layer fabricated according to the chemical vapor deposition method, a pressure thereof is controlled between 800 mtor-1500 mtor, and an output power is controlled between 300 W-800 W. Then, gases such as silicon methane ($SiH_4$), nitrous oxide ($N_2O$), phosphine ($PH_3$), and hydrogen ($H_2$), etc. are input to deposit an N-type doped silicon rich oxide ($SiO_x$) layer. Moreover, if the input gasses are changed to the gases such as silicon methane ($SiH_4$), ammonia ($NH_3$), phosphine ($PH_3$), and hydrogen ($H_2$), etc., an N-type doped silicon rich nitride ($SiN_y$) layer is deposited. Similarly, if the input gases are changed to the gases such as silicon methane ($SiH_4$), nitrous oxide ($N_2O$), ammonia ($NH_3$), phosphine ($PH_3$), and hydrogen ($H_2$), etc., and a gas volume ratio between the ammonia and the nitrous oxide is, for example, between 100-600 (in the present embodiment, the gas volume ratio is, for example, 100), an N-type doped silicon rich oxynitride ($SiO_xN_y$) layer is then deposited. In this case, a gas flux of the silicon methane is, for example, 100-1500 sccm (standard cubic centimetre per minute), a gas flux of the nitrous oxide is, for example, 10-600 sccm, a gas flux of the ammonia is, for example, 10-600 sccm, a gas flux of the phosphine is, for example, 100-2000 sccm, and a gas flux of the hydrogen is, for example, 100-4000 sccm. The aforementioned fabrication conditions are only used as an example, and a ratio of the input gases can be suitably adjusted according to a demand of the user, which is not limited by the present invention.

Moreover, regarding fabrication conditions of the P-type doped silicon-rich dielectric layer fabricated according to the chemical vapor deposition method, a pressure thereof is controlled between 800 mtor-1500 mtor, and an output power is controlled between 300 W-800 W. Then, gases such as silicon methane ($SiH_4$), nitrous oxide ($N_2O$), diboride hydrogen ($B_2H_6$), and hydrogen ($H_2$), etc. are input to deposit a P-type doped silicon rich oxide ($SiO_x$) layer. Moreover, if the input gasses are changed to the gases such as silicon methane ($SiH_4$), ammonia ($NH_3$), diboride hydrogen ($B_2H_6$), and hydrogen ($H_2$), etc., a P-type doped silicon rich nitride ($SiN_y$) layer is deposited. Similarly, if the input gases are changed to the gases such as silicon methane ($SiH_4$), nitrous oxide ($N_2O$), ammonia ($NH_3$), diboride hydrogen ($B_2H_6$), and hydrogen ($H_2$), etc., and a gas volume ratio between the ammonia and the nitrous oxide is, for example, between 100-600 (in the present embodiment, the gas volume ratio is, for example, 100), a P-type doped silicon rich oxynitride ($SiO_xN_y$) layer is then deposited. In this case, a gas flux of the silicon methane is, for example, 100-1500 sccm, a gas flux of the nitrous oxide is, for example, 10-600 sccm, a gas flux of the ammonia is, for example, 10-600 sccm, a gas flux of the diboride hydrogen is, for example, 100-2000 sccm, and a gas flux of the hydrogen is, for example, 100-4000 sccm. The aforementioned fabrication conditions are only used as an example, and a ratio of the input gases can be suitably adjusted according to a demand of the user, which is not limited by the present invention.

It should be noticed that during the step of forming the first type doped silicon-rich dielectric layer 256 and the second type doped silicon-rich dielectric layer 258, an excimer laser annealing process can further be performed, so as to form the aforementioned silicon nanoparticles in the first type doped silicon-rich dielectric layer 256 and the second type doped silicon-rich dielectric layer 258. Descriptions of the nanoparticles and the advantage of using the nanoparticles have been described in the aforementioned embodiment, and therefore detail descriptions thereof are not repeated.

Figure 3J:
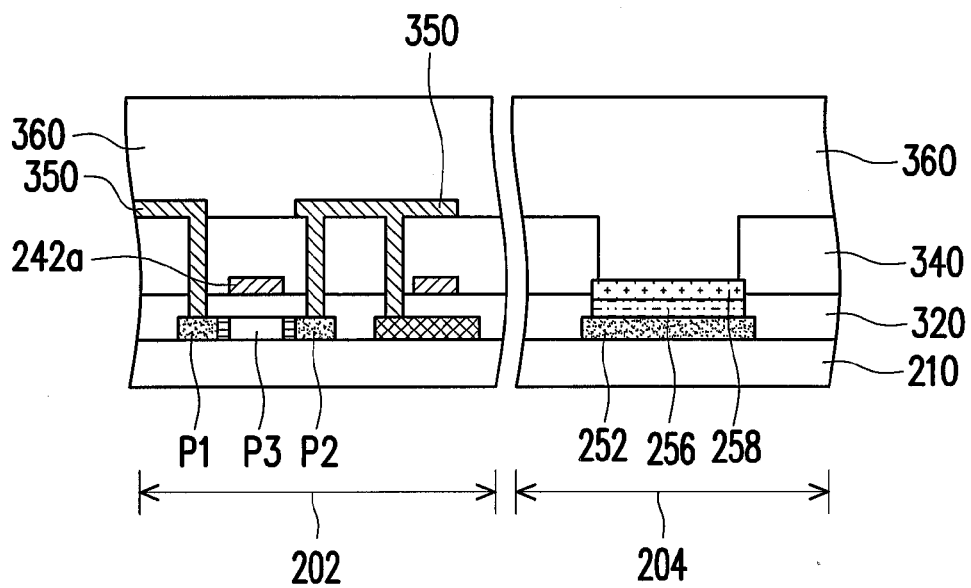
Figure 3K:
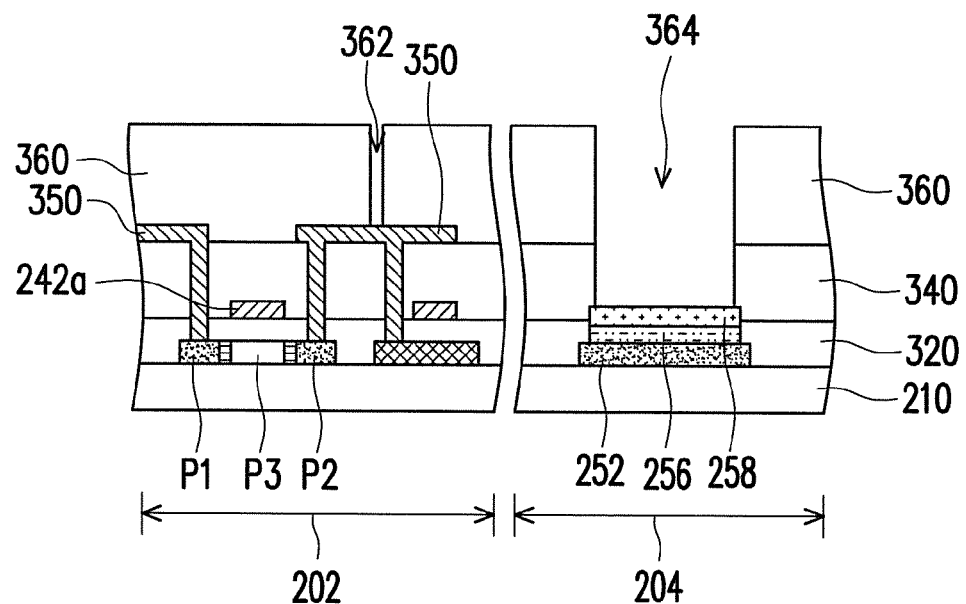
Figure 3L:
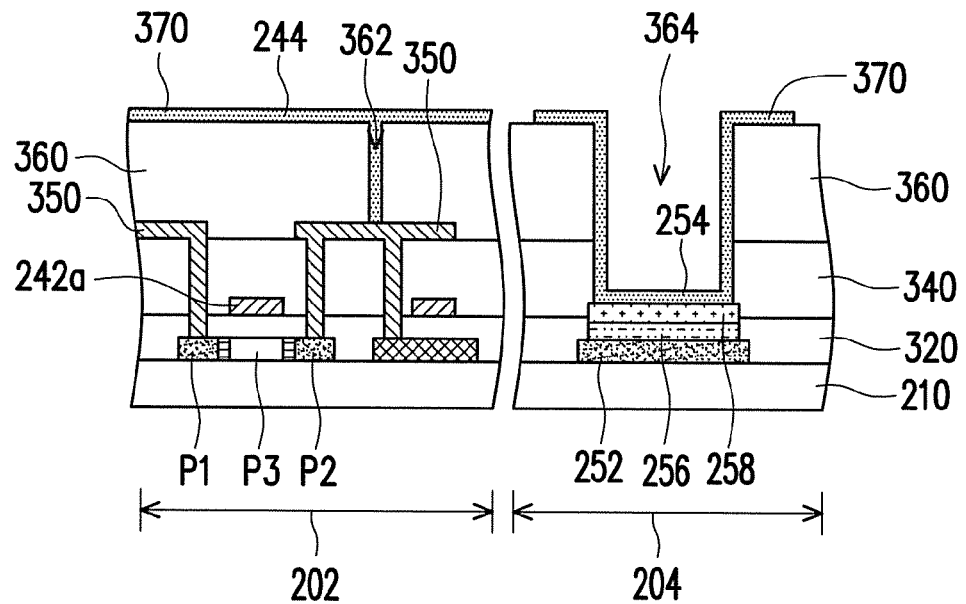

Next, a passivation layer 360 is formed on the substrate 210 to cover the inter-layer dielectric layer 340, the second patterned metal layer 350 and the second type doped silicon-rich dielectric layer 258, as that shown in FIG. 3J. Next, a plurality of second via holes 362 and a second opening 364 are formed in the passivation layer 360, as that shown in FIG. 3K. Wherein, the second via holes 362 respectively expose the corresponding second patterned metal layer 350, and the second opening 364 exposes the second type doped silicon-rich dielectric layer 258. In the present embodiment, a method of forming the passivation layer 360 and a material thereof are similar to that of the aforementioned gate insulator layer 320, and therefore detail descriptions thereof are not repeated. The second via holes 362 and the second opening 364 are, for example, formed by an etching pro Next, a patterned transparent conductive layer 370 is formed on the passivation layer 360, and is filled in the second via holes 362 and the second opening 364, so as to respectively form a plurality of pixel electrodes 244 on the pixel region 202 and a transparent electrode layer 254 on the second type doped silicon-rich dielectric layer 258, as that shown in FIG. 3L. In the present embodiment, a method of forming the patterned transparent conductive layer 370 is similar to the method of forming the first patterned metal layer 330, though the materials of the patterned transparent conductive layer 370 and the first patterned metal layer 330 are different. For example, the material of the patterned transparent conductive layer 370 is indium tin oxide, indium zinc oxide, zinc indium tin oxide, hafnium oxide, zinc oxide, aluminium oxide, aluminium tin oxide, aluminium zinc oxide, cadmium tin oxide, cadmium zinc oxide, or other suitable materials, or a combination thereof.

Next, the first substrate 210 processed according to the aforementioned steps and the second substrate 220 are assembled, and the display medium layer 230 is disposed between the first substrate 210 and the second substrate 220, so as to form the layer structure of the display panel 200 shown in FIG. 2B. Wherein, the display medium layer 230 is, for example, a liquid crystal layer, and is disposed between the first substrate 210 and the second substrate 220 according to a filling method. The filling method can be a vacuum filling method or a one drop filling (ODF) method. In detail, regarding the vacuum filling method, a pressure between the first substrate 210 and the second substrate 220 is less than an external pressure, so that the liquid crystal molecules can be filled in internal of the display panel 200 due to the external pressure. While, regarding the ODF method, before the first substrate 210 and the second substrate 220 are assembled, the liquid crystal molecules are filled in the first substrate 210 or the second substrate 220 having a sealant (not shown) according to the ODF method. Thereafter, the first substrate 210 and the second substrate 220 are adhered by the sealant (not shown). Until now, manufacturing of the display panel 200 is approximately completed, wherein the film structure of the peripheral circuit region 206 illustrated in FIG. 2A and FIG. 2B can be simultaneously fabricated when the pixel structure 240 of the pixel region 202 is fabricated, which is known by those with ordinary skill in the art, and therefore detail description thereof is not repeated.

Moreover, the manufacturing method of the display panel 200 further includes forming the intrinsic layer 251 between the first type doped silicon-rich dielectric layer 256 and the second type doped silicon-rich dielectric layer 258, as that shown in FIG. 2B. Wherein, a method of forming the intrinsic layer 251 is, for example, a plasma enhanced chemical vapor deposition (PECVD) method, or is the same to the method of forming the first type doped silicon-rich dielectric layer 256 and the second type doped silicon-rich dielectric layer 258.

Figure 4:
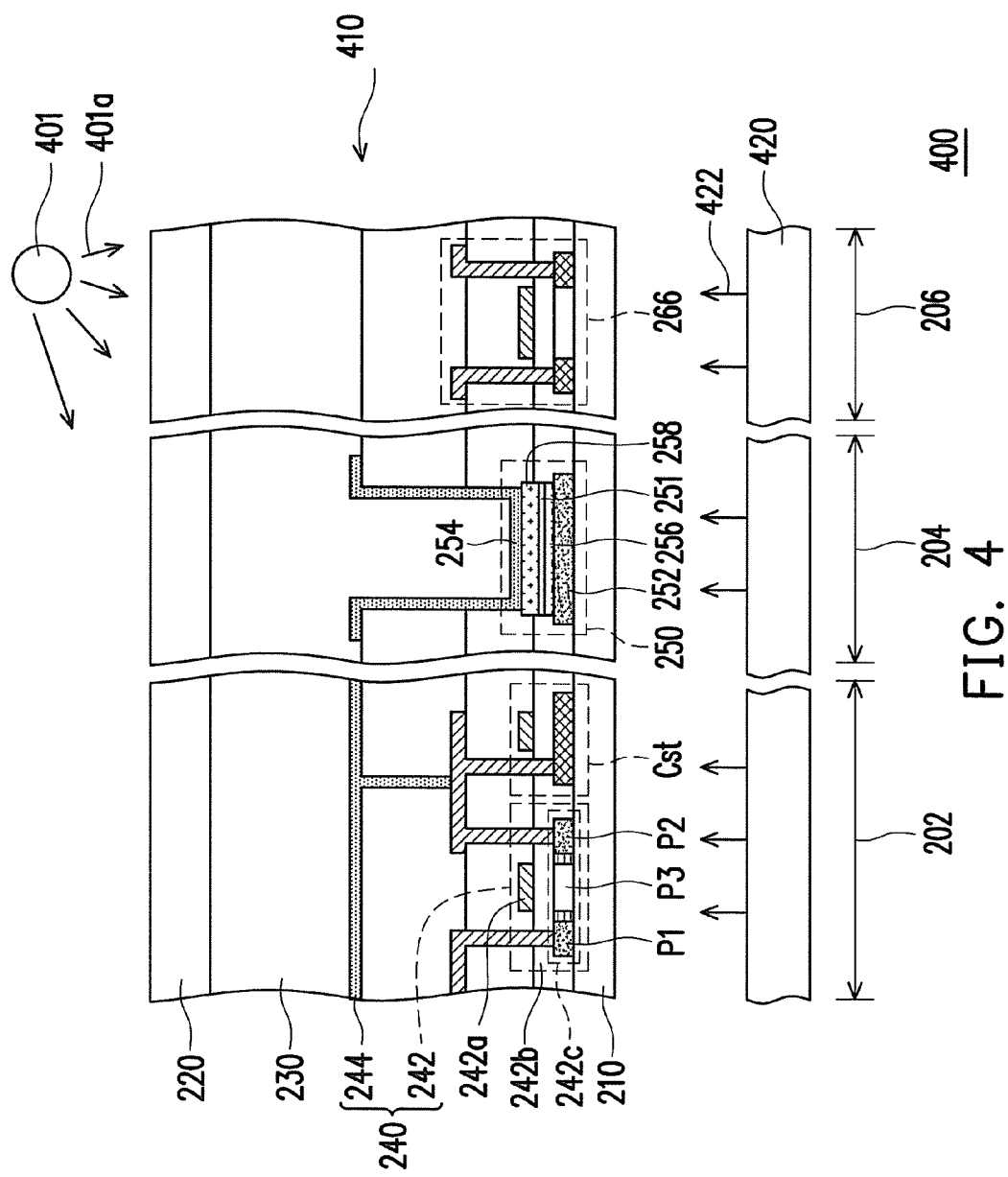
FIG. 4 is a cross-sectional view of a liquid crystal display apparatus according to another embodiment of the present invention.

FIG. 4 is a cross-sectional view of a liquid crystal display (LCD) apparatus according to another embodiment of the present invention. Referring to FIG. 4, the LCD apparatus 400 includes an LCD panel 410 and a backlight module 420. The LCD panel 410 is, for example, the aforementioned display panel 200, wherein the display medium layer 230 in the display panel 200 is a liquid crystal layer. The backlight module 420 is disposed at a side of the LCD panel 410, and is located adjacent to the first substrate 210, which is used for providing a light source (not shown) to the LCD panel 410.

In the present embodiment, since the LCD panel 410 applies a design of the aforementioned display panel 200, it has the aforementioned advantages and features of the display panel 200. Namely, the LCD apparatus 400 can receive an external light 401a (the light of the sun 401 illustrated in FIG. 4), and the photo-voltaic cell device 250 in the LCD apparatus 400 can convert the light 401a into the electric energy to provide a part of the electric energy required by the LCD apparatus 400. Moreover, the LCD apparatus 400 can also convert a light 422 provided by the backlight module 420 into the electric energy, so that a light using rate and a reusing rate of energy can be improved, and meanwhile a concept of carbon reduction and green energy can be achieved.

In summary, the thin film transistor array substrate, the display panel and the LCD apparatus of the present invention has at least the following advantages. First, when the active layer of the thin film transistor is formed on the substrate, the doped semiconductor layer of the photo-voltaic cell device is simultaneously formed on the substrate, wherein the doped semiconductor layer can be regarded as a first electrode of the photo-voltaic cell device. Moreover, when the pixel electrode of the pixel structure is fabricated, the transparent electrode layer of the photo-voltaic cell device is simultaneously formed, wherein the transparent electrode layer can be regarded as a second electrode of the photo-voltaic cell device. By such means, a fabrication process for fabricating the photo-voltaic cell device on the thin film transistor array substrate, the display panel or the LCD apparatus is simplified. Moreover, since the doped semiconductor layer serves as the first electrode of the photo-voltaic cell device, and the material of the pixel electrode serves as the second electrode, the light can respectively penetrate through the first electrode and the second electrode to reach the photosensitive dielectric layer in the internal of the photo-voltaic cell device, so that the light energy can be converted into the electric energy, and the electric energy can be provided to the thin film transistor array substrate, the display panel and the LCD apparatus for utilization. Further, besides using the external light (for example, the sun light or an environmental light) to provide power, the photo-voltaic cell device can also use the internal light (for example, the light provided by the backlight module) to provide power, so that a using efficiency of the photo-voltaic cell device is improved, and the light using rate and the reusing rate of energy can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel, having a pixel region and a sensing region, comprising:
   a first substrate including a plurality of pixel structures disposed on the first substrate, the pixel structures being arranged in the pixel region in an array, wherein each of the pixel structures comprises a thin film transistor and a pixel electrode electrically connected to the thin film transistor, the thin film transistor comprises a gate electrode, a gate insulator layer and an active layer;
   at least one photo-voltaic cell device being disposed on the sensing region of the first substrate, and the photo-voltaic cell device comprises:
      a doped semiconductor layer, wherein the active layer and the doped semiconductor layer of the photo-voltaic cell device are made in the same layer;
      a transparent electrode layer;
      a first type doped silicon-rich dielectric layer, doped with a first type ion;
      a second type doped silicon-rich dielectric layer, doped with a second type ion, the first type doped silicon-rich dielectric layer and the second type doped silicon-rich dielectric layer being disposed between the doped semiconductor layer and the transparent electrode layer;
   a second substrate, disposed opposite to the first substrate; and
   a display medium layer, disposed between the first substrate and the second substrate.

2. The display panel as claimed in claim 1, wherein the thin film transistor comprises a low temperature polysilicon thin film transistor (LTPS TFT).

3. The display panel as claimed in claim 1, wherein the active layer comprises a source doped region, a drain doped region and a channel region located between the source doped region and the drain doped region.

4. The display panel as claimed in claim 3, wherein a material of the source doped region or the drain doped region is the same to a material of the doped semiconductor layer.

5. The display panel as claimed in claim 1, wherein the pixel electrode of the pixel structure and the transparent electrode layer of the photo-voltaic cell device are in the same layer.

6. The display panel as claimed in claim 1, further comprising an intrinsic layer disposed between the first type doped silicon-rich dielectric layer and the second type doped silicon-rich dielectric layer.

7. The display panel as claimed in claim 6, wherein a material of the intrinsic layer comprises amorphous silicon, polysilicon, silicon-rich dielectric layer or a combination thereof.

8. The display panel as claimed in claim 7, wherein the silicon-rich dielectric layer comprises a silicon-rich silicon oxide layer, a silicon-rich silicon nitride layer, a silicon-rich silicon oxynitride layer, a silicon-rich silicon carbide layer, or a combination thereof.

9. The display panel as claimed in claim 1, wherein the first type doped silicon-rich dielectric layer and the second type doped silicon-rich dielectric layer further comprise silicon nanoparticles.

10. The display panel as claimed in claim 1, wherein the first type doped silicon-rich dielectric layer comprises an N-type doped silicon-rich dielectric layer, and the second type doped silicon-rich dielectric layer comprises a P-type doped silicon-rich dielectric layer.

11. The display panel as claimed in claim 1, further comprising a peripheral circuit region located aside the pixel region, wherein a peripheral circuit is disposed on the first substrate, and is located in the peripheral circuit region.

12. The display panel as claimed in claim 1, wherein the doped semiconductor layer is a first electrode of the photo-voltaic cell device and the transparent electrode layer is a second electrode of the photo-voltaic cell device.

13. A liquid crystal display (LCD) apparatus, comprising:
   an LCD panel, having a pixel region and a sensing region, and the LCD panel comprising a first substrate, a second substrate and a liquid crystal layer, the second substrate being disposed opposite to the first substrate, and the liquid crystal layer being disposed between the first substrate and the second substrate, a plurality of pixel structures being arranged in the pixel region in an array, and each of the pixel structures comprising a thin film transistor and a pixel electrode electrically connected to the thin film transistor, wherein the thin film transistor comprises a gate electrode, a gate insulator layer and an active layer;
   at least one photo-voltaic cell device being disposed on the sensing region of the first substrate, and the photo-voltaic cell device comprises:
      a doped semiconductor layer, wherein the active layer and the doped semiconductor layer of the photo-voltaic cell device are made in the same layer;
      a transparent electrode layer;
      a first type doped silicon-rich dielectric layer, doped with a first type ion;
      a second type doped silicon-rich dielectric layer, doped with a second type ion, wherein the first type doped silicon-rich dielectric layer and the second type doped silicon-rich dielectric layer are disposed between the doped semiconductor layer and the transparent electrode layer; and
   a backlight module, disposed at a side of the LCD panel, and located adjacent to the first substrate to provide a light source to the LCD panel.

14. The LCD apparatus as claimed in claim 13, further comprising a peripheral circuit region located aside the pixel region, wherein a peripheral circuit is disposed on the first substrate, and is located in the peripheral circuit region.

15. The display panel as claimed in claim 13, wherein the doped semiconductor layer is a first electrode of the photo-voltaic cell device and the transparent electrode layer is a second electrode of the photo-voltaic cell device.

16. A thin film transistor array substrate, comprising:
   a substrate, having a pixel region and a sensing region;
   a plurality of pixel structures, arranged in the pixel region of the substrate in an array, wherein each of the pixel structures comprises a thin film transistor and a pixel electrode electrically connected to the thin film transistor, and the thin film transistor comprises a gate electrode, a gate insulator layer and an active layer;

at least one photo-voltaic cell device, disposed on the sensing region of the substrate, wherein the photo-voltaic cell device comprises:
  a doped semiconductor layer, wherein the active layer and the doped semiconductor layer of the photo-voltaic cell device are made in the same layer;
  a transparent electrode layer;
  a first type doped silicon-rich dielectric layer, doped with a first type ion; and
  a second type doped silicon-rich dielectric layer, doped with a second type ion, wherein the first type doped silicon-rich dielectric layer and the second type doped silicon-rich dielectric layer are disposed between the doped semiconductor layer and the transparent electrode layer.

17. The display panel as claimed in claim 16, wherein the doped semiconductor layer is a first electrode of the photo-voltaic cell device and the transparent electrode layer is a second electrode of the photo-voltaic cell device.

* * * * *